(12) United States Patent
Mokhlesi

(10) Patent No.: US 7,870,457 B2
(45) Date of Patent: *Jan. 11, 2011

(54) PAGE BY PAGE ECC VARIATION IN A MEMORY DEVICE

(75) Inventor: Nima Mokhlesi, Los Gatos, CA (US)

(73) Assignee: Sandisk Corporation, Milpitas, CA (US)

( * ) Notice: Subject to any disclaimer, the term of this patent is extended or adjusted under 35 U.S.C. 154(b) by 1022 days.

This patent is subject to a terminal disclaimer.

(21) Appl. No.: 11/618,686

(22) Filed: Dec. 29, 2006

(65) Prior Publication Data

US 2008/0158959 A1 Jul. 3, 2008

(51) Int. Cl.
*H03M 13/00* (2006.01)
(52) U.S. Cl. ...................... 714/752; 714/763
(58) Field of Classification Search ............ 714/752, 714/758, 763
See application file for complete search history.

(56) References Cited

U.S. PATENT DOCUMENTS 6,041,001 A * 3/2000 Estakhri ............ 365/200

2006/0206770 A1 9/2006 Chen et al.

OTHER PUBLICATIONS

Written Opinion and International Search Report, dated May 13, 2008, PCT/US2007/088830.
International Preliminary Report on Patenability and Written Opinion of the International Searching Authority dated Jun. 30, 2009 in PCT Application No. PCT/US2007/088830.
U.S. Appl. No. 11/618,694, filed Dec. 29, 2006.
Office Action dated Mar. 30, 2010, U.S. Appl. No. 11/618,694, filed Dec. 29, 2006.
Amendment dated Jun. 30, 2010, U.S. Appl. No. 11/618,694, filed Dec. 29, 2006.

* cited by examiner

*Primary Examiner*—Sam Rizk
(74) *Attorney, Agent, or Firm*—Vierra Magen Marcus & DeNiro LLP

(57) ABSTRACT

A method of storing memory device data overhead information in data cells in a row of cells, the row being one of a plurality of rows comprising a unit of data, is disclosed. The method includes storing user data attribute information in an overhead portion of a data sector in the row adjacent to a portion of the data sector storing user data. Data attributes for user data in data sectors in other rows is stored in the overhead portion of the data sector, said row having greater user data integrity than others of said rows.

20 Claims, 7 Drawing Sheets

PAGE BY PAGE ECC VARIATION IN A MEMORY DEVICE

BACKGROUND OF THE INVENTION

1. Field of the Invention

The present invention relates to technology for non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices.

Electrical Erasable Programmable Read Only Memory (EEPROM) and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, electrons from the channel are injected into the floating gate. When electrons accumulate in the floating gate, the floating gate becomes negatively charged and the threshold voltage of the memory cell is raised so that the memory cell is in a programmed state. Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device. A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device. More information about programming can be found in U.S. Pat. No. 6,859,397, titled "Source Side Self Boosting Technique for Non-Volatile Memory," and in U.S. Pat. No. 6,917,542, titled "Detecting Over Programmed Memory," both incorporated herein by reference in their entirety.

Shifts in the apparent charge stored on a floating gate or other charge region can occur because of the coupling of an electric field based on the charge stored in adjacent floating gates. This floating gate to floating gate coupling phenomenon is described in U.S. Pat. No. 5,867,429, which is incorporated herein by reference in its entirety. An adjacent floating gate to a target floating gate may include neighboring floating gates that are on the same bit line, neighboring floating gates on the same word line, or floating gates that are diagonal from the target floating gate because they are on both a neighboring bit line and neighboring word line.

Floating gate to floating gate coupling occurs most pronouncedly between sets of adjacent memory cells that have been programmed at different times. For example, a first memory cell may be programmed to add a level of charge to its floating gate that corresponds to one set of data. Subsequently, one or more adjacent memory cells are programmed to add a level of charge to their floating gates that corresponds to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The effect of floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range.

In the types of memory systems described herein, as well as in others, including magnetic disc storage systems, the integrity of the data being stored is maintained by use of an error correction technique. Most commonly, an error correction code (ECC) is calculated for each sector or other unit of data that is being stored at one time, and that ECC is stored along with the data. The ECC is most commonly stored together with the sector of user data from which the ECC has been calculated. When this data is read from the memory, the ECC is used to determine the integrity of the user data being read. One or a few erroneous bits of data within a sector of data can often be corrected by use of the ECC but the existence of more errors renders the attempted data read to fail. Thus, the existence of bits that are read incorrectly because of close field coupling with adjacent memory cells can cause an attempted data read to fail.

SUMMARY OF THE INVENTION

Technology is disclosed for storing overhead information in a memory device. In one embodiment, a method of storing memory device data overhead information in data cells in a row of cells, the row being one of a plurality of rows comprising a unit of data, is disclosed. The method includes storing user data attribute information in an overhead portion of a data sector in the word line adjacent to a portion of the data sector storing user data. The attribute information is stored in a location normally used for ECC information and in row having greater user data integrity than others of said rows. Numerous techniques for ensuring that the row has such greater integrity are disclosed. In a further aspect, the user data attributes include block level information.

In another embodiment, a method of storing overhead information in data cells organized as a plurality of pages in a block in a memory device is disclosed. A subset of the plurality of pages is defined as a block of data. The method includes storing user data in a portion of a first page and storing block level data attributes for the user data in a second portion of the first page. The page has a higher degree of data integrity than others of said pages and the data is stored in a location normally occupied by ECC information.

In accordance with the technology, better use of rows which can be assured to have greater data reliability is provided.

DETAILED DESCRIPTION

Technology is disclosed herein for optimizing the use of overhead in pages of data which have greater data reliability. Greater reliability can result from being subject to little or less floating-gate to floating-gate coupling or a row being designed to have greater spacing and/or greater line width (and hence greater channel lengths) from adjacent rows. User data is stored along with overhead information associated with overhead information concerning a logical block of data comprised of a set of pages. Such overhead information includes block hot count, compressed block hot count, a block rewrite flag, and logical to physical translation information. This overhead information can be stored in a portion of a page normally used for ECC information, since less ECC capability is required due to the greater reliability of the page.

Figure 1:
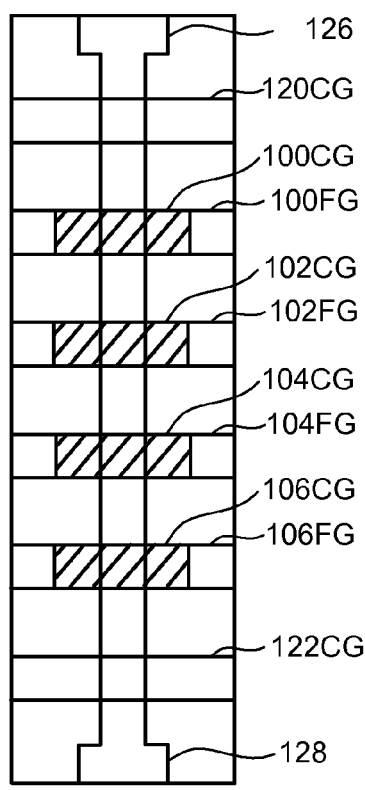
FIG. 1 is a top view of a NAND string.
Figure 2:
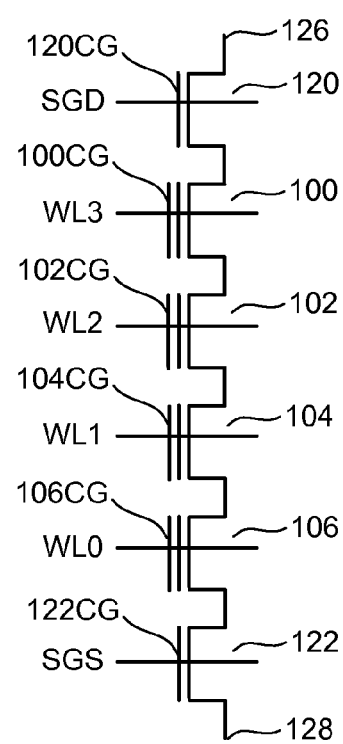
FIG. 2 is an equivalent circuit diagram of the NAND string.

The technology will be described with respect to one example of a flash memory system using a NAND structure which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by the applying appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0.

Figure 3:
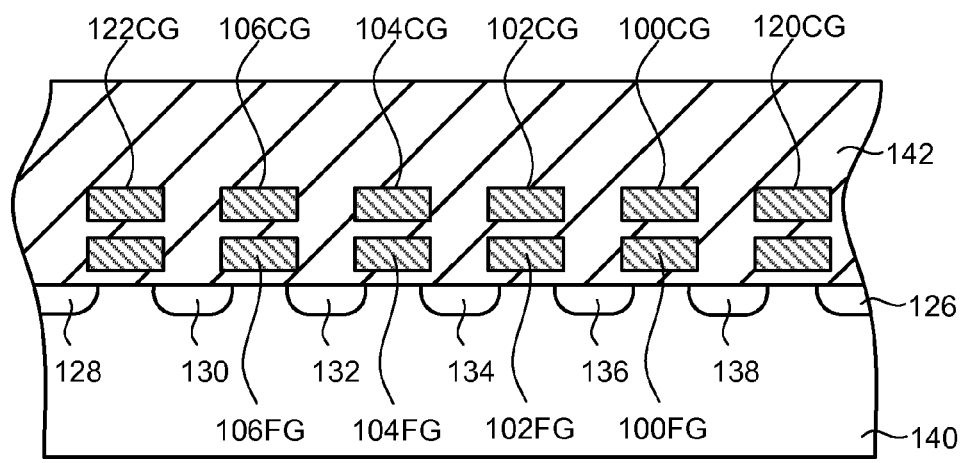
FIG. 3 is a cross sectional view of the NAND string.

FIG. 3 provides a cross-sectional view of the NAND string described above. As depicted in FIG. 3, the transistors (also called cells or memory cells) of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an oxide layer separating the control gate and floating gate. Note that FIG. 3 appears to depict a control gate and floating gate for transistors 120 and 122. However, for transistors 120 and 122, the control gate and the floating gate are connected together. The control gates of the memory cells (100, 102, 104, 106) form the word lines. N+ diffused layers 130, 132, 134, 136 and 138 are shared between neighboring cells whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1-3 shows four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

Relevant examples of NAND type flash memories and their operation are provided in the following U.S. Patents/Patent Applications, all of which are incorporated herein by reference in their entirety: U.S. Pat. Nos. 5,570,315; 5,774,397, 6,046,935, 6,456,528 and U.S. patent application Ser. No. 09/893,277 (Publication No. US2003/0002348). Other types of flash memory devices can also be used with the present invention. For example, the following patents describe NOR type flash memories and are incorporated herein by reference in their entirety: U.S. Pat. Nos. 5,095,344; 5,172,338; and 5,890,192. Another example of a flash memory type is found in U.S. Pat. No. 6,151,248, incorporated herein by reference in its entirety.

Figure 4:
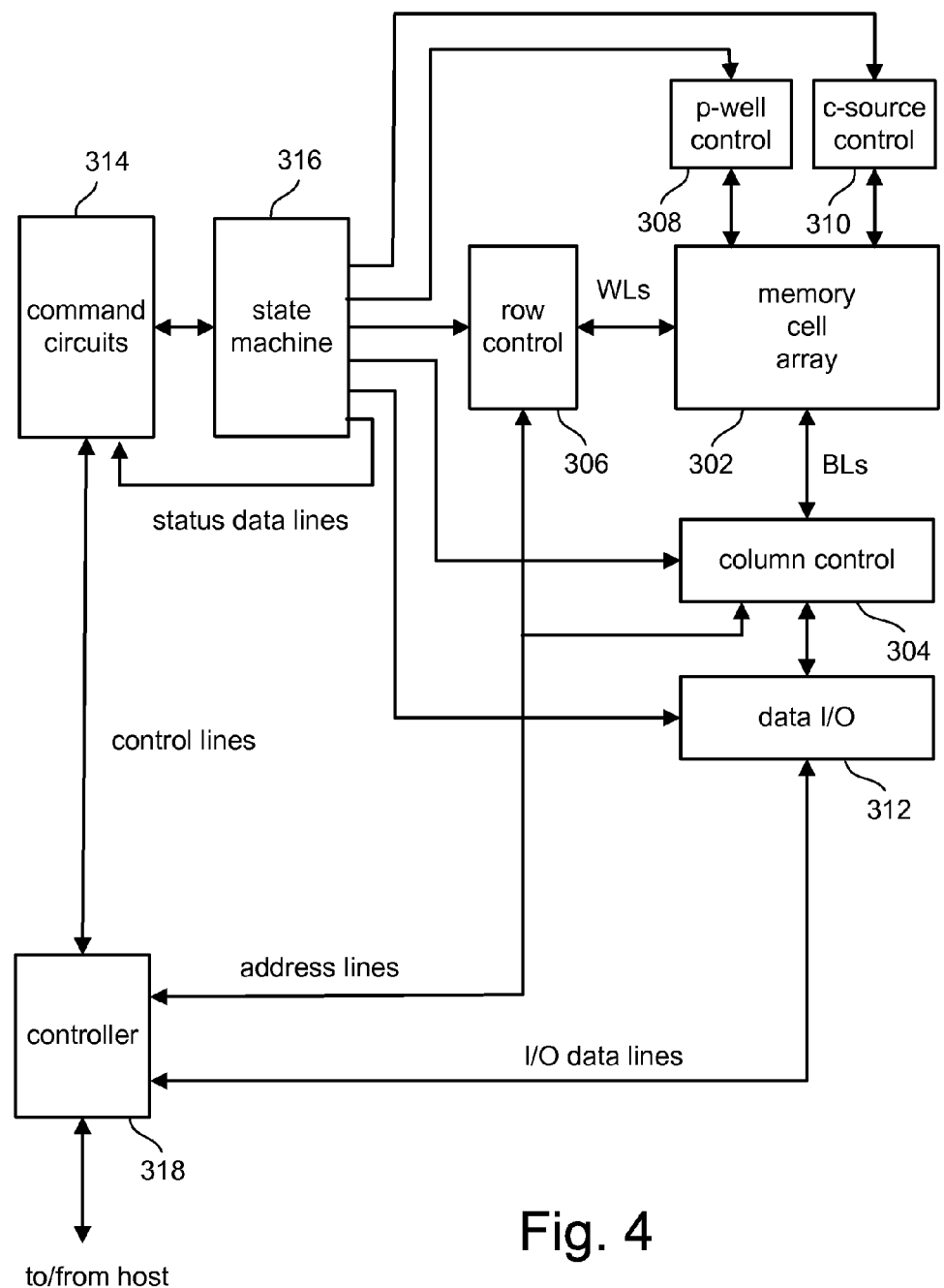
FIG. 4 is a block diagram of a non-volatile memory system.

FIG. 4 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316, which controls column control circuit 304, row control circuit 306, c-source control circuit 310, p-well control circuit 308 and data input/output buffer 312. State machine 316 can also output status data of the flash memory such as READY/BUSY or PASS/FAIL.

Controller 318 is connected or connectable with a host system such as a personal computer, a digital camera, personal digital assistant, etc. Controller 318 communicates with the host in order to receive commands from the host, receive data from the host, provide data to the host and provide status information to the host. Controller 318 converts commands from the host into command signals that can be interpreted and executed by command circuits 314, which is in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the controller being embedded in the host). Thus, the controller can be embedded in the host or included within a removable memory system.

Figure 5:
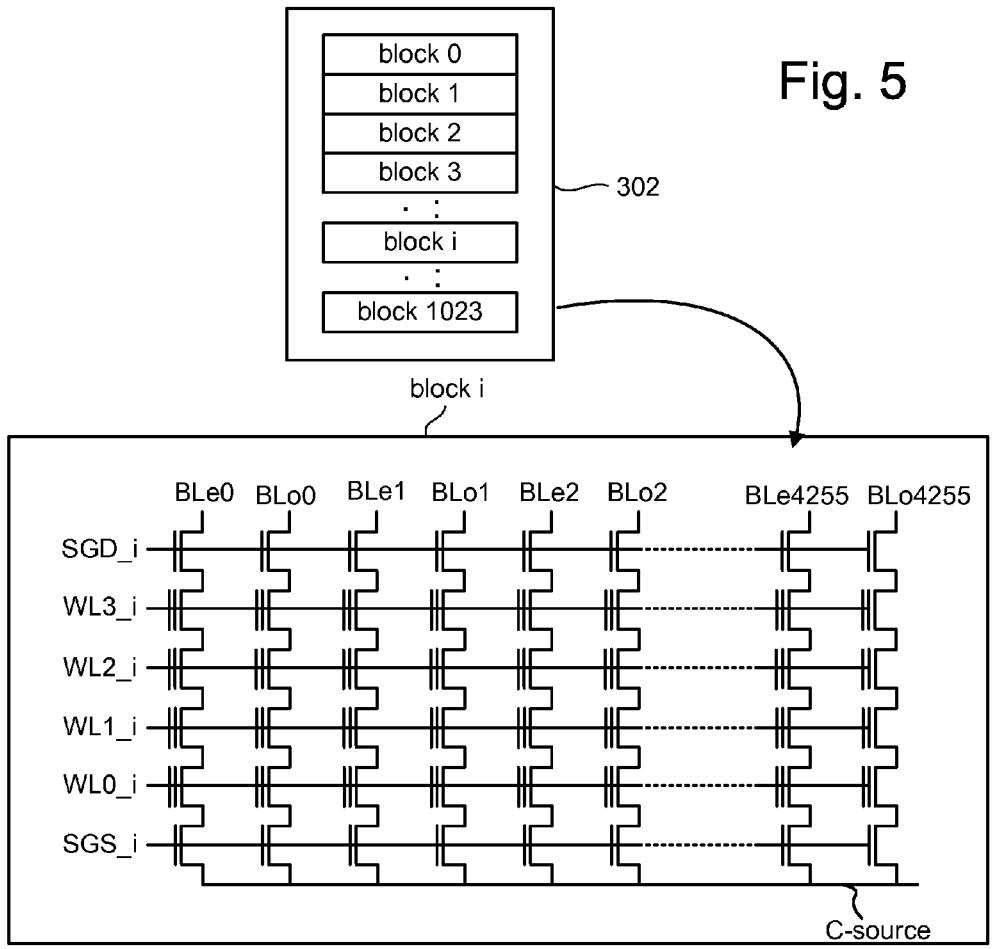
FIG. 5 illustrates an example of an organization of a memory array.
Figure 6:
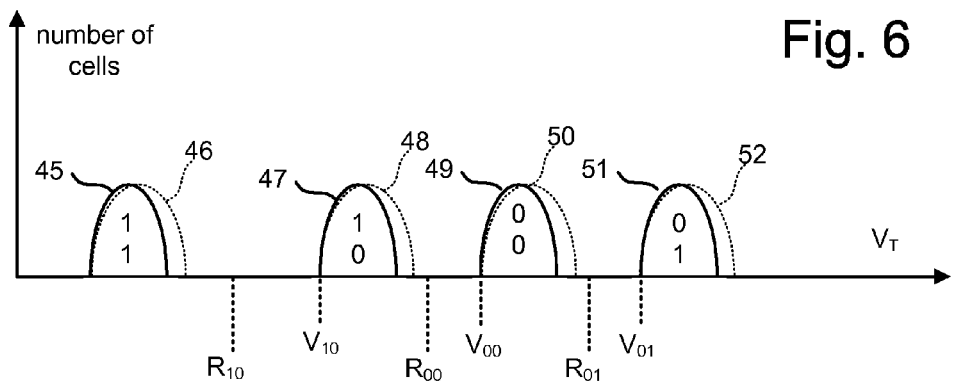
FIG. 6 is a graph illustrating curves of programmed memory cell level distributions.

With reference to FIG. 5, an example structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 6 shows four memory cells connected in series to form a NAND string. Although four cells are shown to be included in each NAND string, more or less than four can be used. One terminal of the NAND string is connected to corresponding bit line via a first select transistor SGD, and another terminal is connected to c-source via a second select transistor SGS.

The number of memory cells in a "page" that are programmed or read simultaneously may vary according to the size of data sent or requested by a host system. There are several ways to program the memory cells coupled to a single word line, such as (1) programming even bit lines and odd bit lines separately, which may comprise upper page programming and lower page programming, (2) programming all the bit lines ("all-bit-line programming"), or (3) programming all the bit lines in a left or right page separately, which may comprise right page programming and a left page programming.

In one example, during read and programming operations, 4,256 memory cells are simultaneously selected. The memory cells selected have the same word line and the same kind of bit line (e.g. even bit lines). Therefore, 532 bytes of data can be read or programmed simultaneously. These 532 bytes of data that are simultaneously read or programmed form a logical page. Therefore, one block can store at least eight logical pages (four word lines, each with odd and even pages). When each memory cell stores two bits of data (e.g. a multi-level cell), one block stores 16 pages. Other sized blocks and pages can also be used with the present invention.

As illustrated in FIG. 6, at the end of a successful program process, the threshold voltages of the memory cells should be within one or more distributions of threshold voltages for programmed memory cells or within a distribution of threshold voltages for erased memory cells. The range of possible threshold voltages of a memory cell can be divided into ranges which represent distinct memory states. For example, two ranges of threshold voltages can be used to establish two memory states that are assigned logical data "1" and "0." A memory cell can also store multiple bits of digital data by utilizing more than two ranges of threshold voltages to represent distinct memory states. The threshold voltage window can be divided into the number of desired memory states and multiple voltage breakpoint levels used to resolve the individual states. For example, if four states are used, there will be four threshold voltage ranges representing four distinct memory states which can be assigned the data values 11, 10, 01, and 00. The specific relationship between the data programmed into the memory cell and the threshold voltage ranges of the cell depends upon the data encoding scheme adopted for the memory cells. U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

There are a number of factors which may affect the reliability of a page of data. In a number of cases, apparent shifts in the stored charge levels occur because of field coupling between storage elements. The degree of this coupling is necessarily increasing as the sizes of memory cell arrays are being decreased, which is occurring as the result of improvements of integrated circuit manufacturing techniques. The problem occurs most pronouncedly between two groups of adjacent cells that have been programmed at different times. One group of cells is programmed to add a level of charge to their storage elements that corresponds to one set of data. After the second group of cells is programmed with a second set of data, the charge levels read from the storage elements of the first group of cells often appear to be different than programmed because of the effect of the charge on the second group of storage elements being capacitively coupled with the first. This is described in U.S. Pat. No. 5,867,429, which patent is incorporated herein in their entirety by this reference. This patent describes either physically isolating the two groups of storage elements from each other, or taking into account the effect of the charge on the second group of storage elements when reading that of the first group.

Generally, with field effect coupling, there is a shift in a storage element's threshold voltage due to a change in the amount of charge stored in neighboring storage elements. For example, a storage element on a given word line can be affected by capacitive coupling from storage elements on the same word line and on neighboring word lines. The coupling, which is strongest from the adjacent storage elements, causes the threshold voltage of a previously programmed storage element to be shifted higher. The threshold voltage distribution of a set of storage elements is likewise widened. This is undesirable, especially for multi-level storage elements, in which tighter threshold voltage distributions are advantageous.

FIG. 6 shows an example of the effect upon a first group of memory cells, such as a word line of cells, of the later programming of a second group of memory cells, such as an adjacent word line of cells. In this example, four distinct charge levels are defined for each storage element, thereby to store two bits of data on each storage element. Since the level of charge stored on a storage element changes the threshold voltage (Vt) of its memory cell transistor, the threshold voltage is shown on the horizontal axis of the curves of FIG. 6. The solid lines (45, 47, 49, 51) show the distributions of the number of threshold voltages of all the cells in a page immediately after being programmed, before any change is made to the adjacent pages. The vertical axis is the number of cells at each threshold level, the curves having essentially a Gaussian distribution. A curve 45 is the distribution of the cells in the erased state, which, in this example, is also designated as a programmed state of the bits 11. When a block of cells is erased, the cells are reset to the 11 state.

Each cell of a page being programmed to one of the other programmed states 01, 00, or 10 has electrons injected onto its storage element until its threshold reaches the state corresponding respectively to the data being programmed into the cell. Those cells being programmed into the 10 state are alternately pulsed with programming voltages and then verified by use of a read threshold level $R_{10}$. When it is determined that a cell has been programmed to a threshold level above $V_{10}$, programming stops as to that cell but continues for other cells that have not yet reach their verify level. If being programmed to 00, a verify level $V_{00}$ is used. If to 01, a verify level $V_{01}$ is used. The particular data bit pair assigned to each of the distributions 45, 47, 49 and 51 may be different that shown in FIG. 6, and may even be rotated during operation of the memory system in order to even out wear on the array.

The spreading of the distributions that occurs as the result of subsequently programming an adjacent row of cells is shown in dashed lines 46, 48, 50, 52 in FIG. 6. If too many cells spread from below to above one of the reading thresholds R, there can be enough erroneous readings to overwhelm the ECC.

The amount of coupling can likewise be affected by the line width or spacing between adjacent elements. Hence the coupling and disturb of the cells can be reduced, and the data reliability enhanced, by increasing the spacing between certain elements or rows of elements. A decision to space out certain rows may be made during array lay-out, and built into the lithography so that the pattern of which rows have greater line width or have greater spacing from other rows is repeated regularly and consistently across all the blocks. This can result in certain rows in each block having systematically greater channel lengths than other rows. Since current lithography techniques already are performed to create sub-wave length features, in order to counteract optical proximity effects, typical layout designs use layout lines of unequal thicknesses with wider select gates and other end-of-block features at the ends of each block. Such features break the otherwise periodic line and space pattern of the word lines that exists in the middle of the each block. Therefore, the word lines at the ends of the block have to be printed wider than the word lines in the middle of the block. This systematic unequal width of word lines can result in systematic differences in channel lengths of cells depending on their word line address within the block.

Hence, the technology disclosed herein takes advantage of known and currently used features in lithography design to improve storage techniques.

Figure 7:
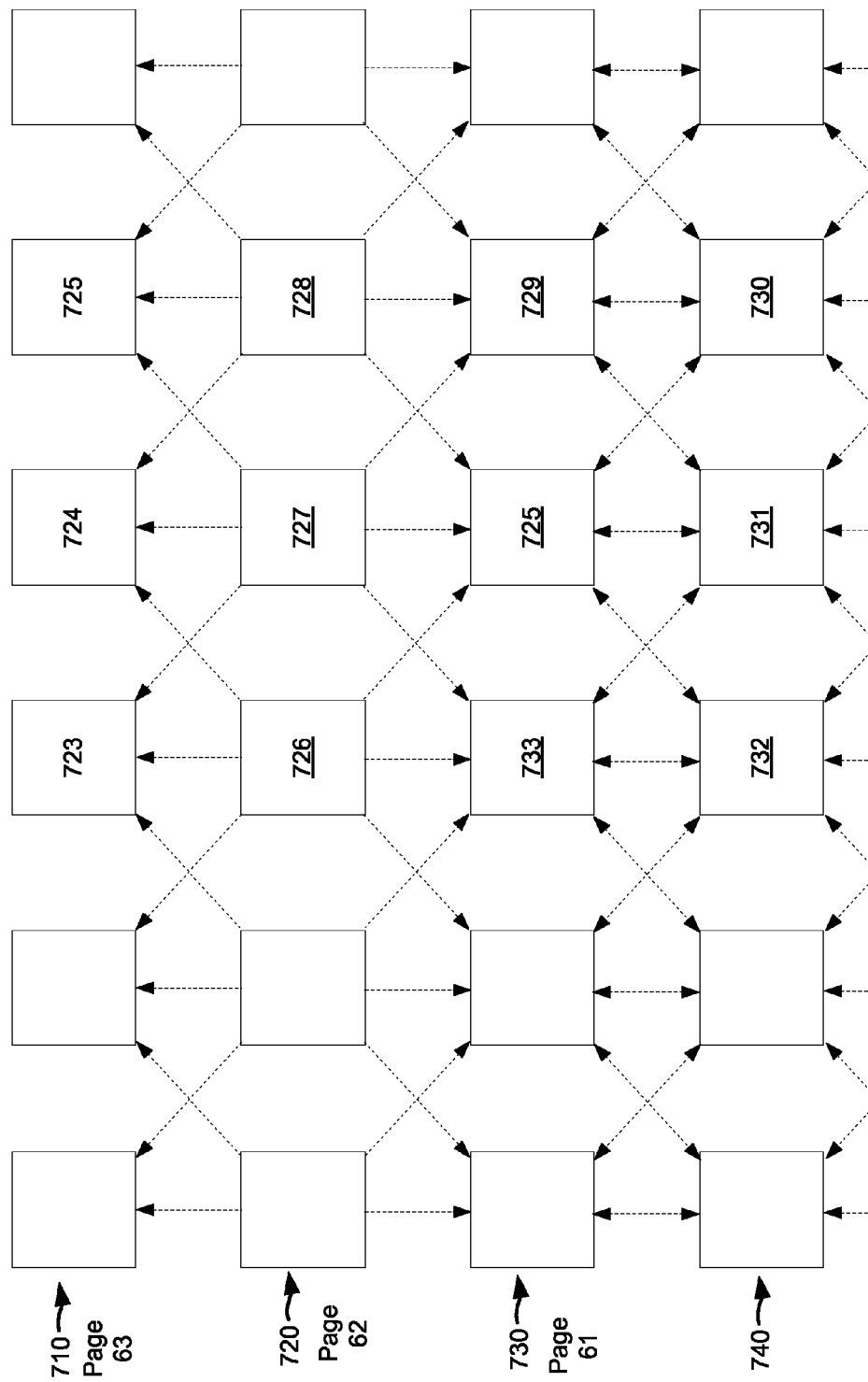
FIG. 7 is a plan view of storage elements illustrating the relative effects of floating gate coupling.

FIG. 7 shows an arrangement of storage elements (squares) in an array of memory cells in order to illustrate the capacitive coupling (dashed lines) between rows of them. Considering a storage element 725 of a row 730, for example, it is field coupled to storage elements in each of the adjacent rows 720 and 740. The storage element 725 is most closely coupled with the storage elements 727 and 731, because of their proximity, but also has a lesser degree of coupling with storage elements 726, 728, 732 and 730 that are further away. The amount of coupling between two storage elements depends upon the distance between them, the dielectric constant of insulating material between them, whether there are any conductive surfaces between them, and the like.

FIG. 7 illustrates only field coupling between rows of storage elements, though such coupling also exists between columns of storage elements. Generally, because data is programmed into memory cells in units of individual rows, the coupling between the rows has been found to be the cause of the apparent shift in programmed levels. For example, if data are programmed as distinct charge levels on the storage elements of the row 730, a later change in the charge levels on either or both of the adjacent rows 720 and 740 will cause a shift in the apparent charge levels that are then read from the storage elements of the row 730. The amount of such a shift in the apparent charge level read from a particular storage element of the row 730 depends upon the degree of coupling with other storage elements whose charge was later changed in level and the amount of that change. When the later change is caused by programming data into the adjacent row, the amounts of the shifts that result are unknown unless the patterns of data programmed into each row are monitored and calculations of their effect made as part of each read operation.

Consider, however, the case where a row is the last row programmed in a page. In FIG. 7, for example, row 720 is the last row programmed. In this instance, as indicated by the unidirectional arrows emanating from the storage elements in the row, the elements in row 720 will not be affected by coupling from adjacent rows of cells. As a result, the expected errors in programming in this row will be significantly reduced. The present technology takes advantage of this expected superiority in data integrity for this row, and any other row in the array for which user data integrity can be expected to be greater than other rows in an array. As discussed below, this applies to cases, for example, where the average channel length is different on different word lines. Cells on word lines that benefit from a longer channel length are more reliable than cells on other word lines.

Figure 11:
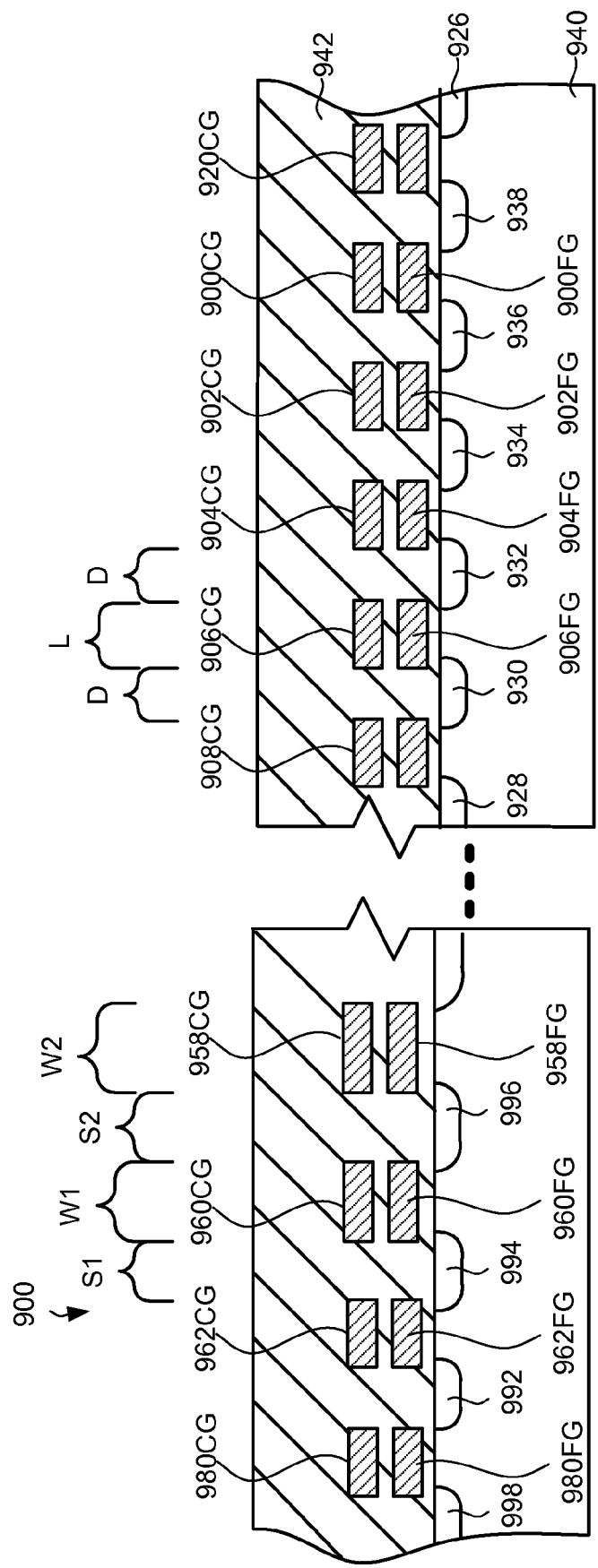
FIG. 11 is a second cross-sectional view of a NAND string.

Consider an array having one or more rows with systematically greater channel lengths for cells residing under particular word lines within each block in the array. For example, consider FIG. 11 a cross-sectional view of the NAND string 900 such as that described above with respect to FIG. 3. A plurality of cells comprising a NAND string is formed in p-well region 940. A block includes word lines of stacked gate structures having control gates (900CG, 902CG, 904CG, 906CG . . . 960CG, 962CG, 980CG) and a floating gate (900FG, 902FG, 904FG, 906FG, 960FG, 962FG, 980FG). Again in FIG. 11, a control gate and floating gate for transistors 920 and 980. However, for transistors 920 and 980, the control gate and the floating gate are connected together. N+ diffused layers 930, 932, 934, 936, 992, 994 and 996 are shared between neighboring cells.

In this example, word lines 958, 960 and 962 have a greater spacing S (S1, S2) and/or line widths W (W1, W2) than other word lines 906, 908, etc. (having spacing D and line width L). Note further that the line widths W1 and W2, and spacings S1 and S2 may be gradually increasing toward the end of the block. As such, the expected reliability of lines 958 and 960 is greater, and such lines lend themselves to use with the technology presented herein.

Figure 8:
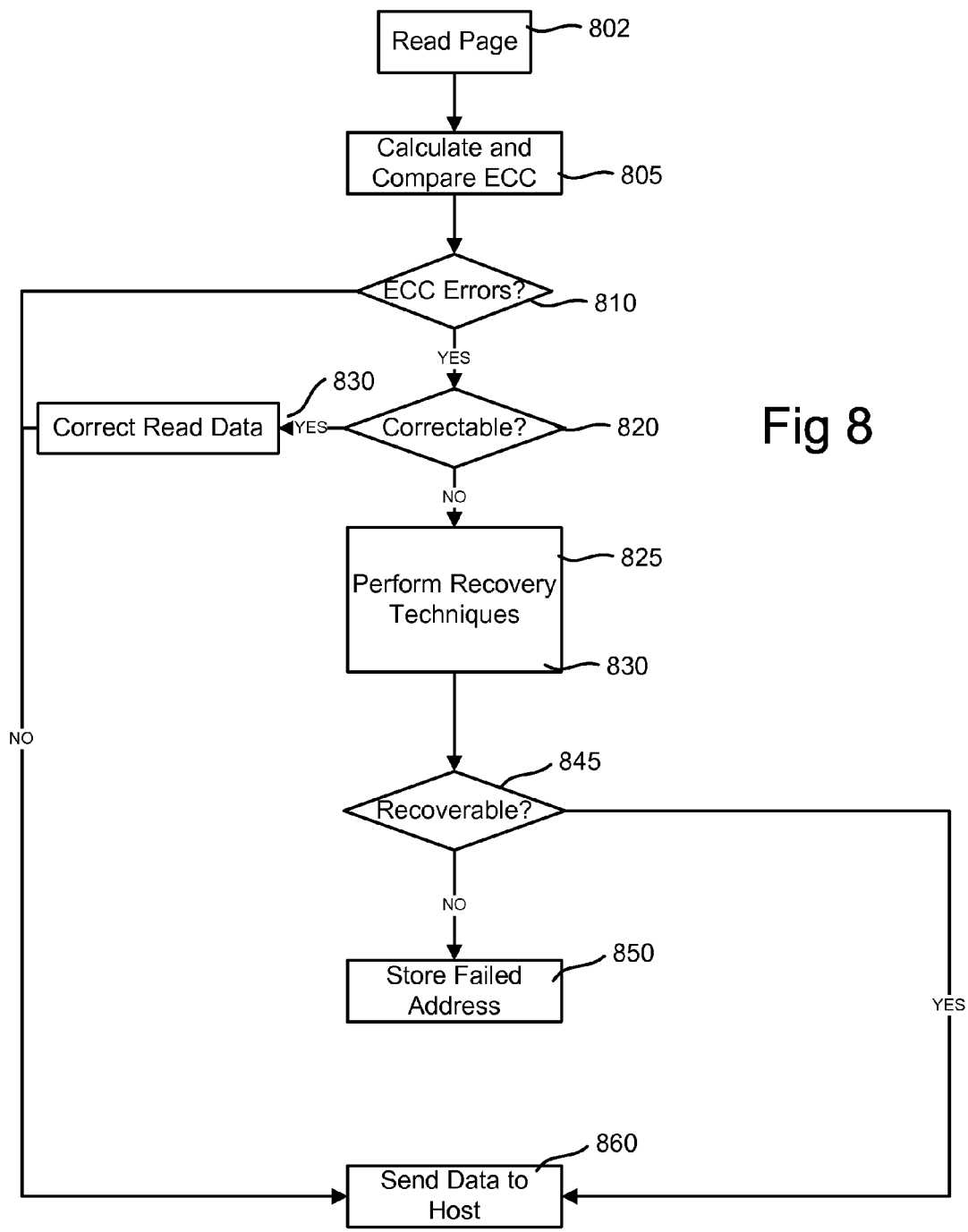
FIG. 8 is a flow chart providing one example of the read operation of the memory system.

The reading process for a page of data is outlined by the flow chart of FIG. 8. A first step 802 is to read the user data and its stored ECC in a normal manner. This can be, for example, a page formed by a row of memory cells as heretofore described. The read data is then compared with the ECC, in a step 805. If there are no errors in the data, as determined by comparison with the ECC, as indicated by the step 810, the read data is sent to the host, as shown by a step 860. This is the process that is followed for most all reads. In other cases, where one or more bit errors in the read data are present, the errors may be correctable, as determined by a step 820. If so, the read data is corrected, in a step 830, and the corrected data than sent to the host, through step 860.

Where the data is determined by the step 820 to not be correctable, any number of recovery techniques identified in numerous issued patents may be employed at step 825. These include those disclosed in, for example, U.S. Pat. Nos. 7,046, 548, 7,009,889 and 7,102,924. and U.S. patent Publication 2005/0162913. If the data is recoverable at step 845, the data is send to the host. If not, the failed address is stored at step 850.

In the aforementioned process, ECC is commonly calculated for each sector or other unit of data that is being stored at one time, and that ECC is stored along with the data. In some embodiments, ECC for one page of data may be stored remotely from the page.

There are two common methods for storing data and page attribute data, such as ECC, information in the same page. The first contains a data area of 512 bytes with the page attribute area directly adjacent to it. The page attribute area in this case is 16 bytes. Therefore, a 2112-byte page could contain four 528-byte elements. The second implementation involves storing the data and page attribute information separately, as disclosed by way of example in U.S. Pat. No. 7,032, 065.

Figure 9:
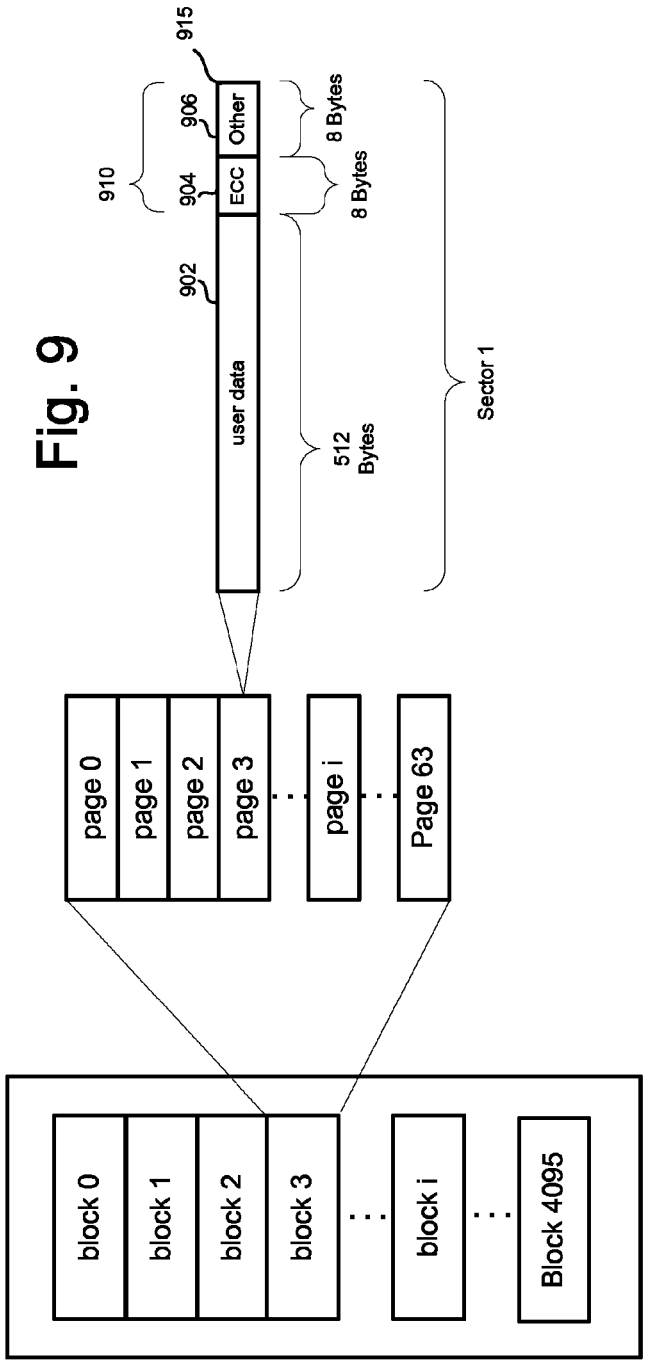
FIG. 9 illustrates the storage of data and overhead information in a page of data.

FIG. 9 illustrates a typical page and block example, where page attribute data is stored with the user data. FIG. 9 illustrates the array and data architectures of one existing commercial memory system. As illustrated in FIGS. 5 and 9, the existing memory array 302 is divided into a large number of blocks B. Each of these blocks, such as a block 3, is divided into a number of pages P, in this case 32 or 64 pages per block. Each page, such as the page 3, is configured in one or more sectors each storing 512 bytes of user data 902 and 16 bytes of attribute data 910. Note that up to eight sectors per word-line may be provided. Each page has the same general data structure. The page attribute data includes ECC data 904 calculated from at least the user data 902, and overhead data 906. During a programming operation, the controller calculates the error-correcting code based on the data stored in the page. The ECC code for the respective data area is then written to the respective page attribute area. When the data is read out, the ECC code is also read, and the reverse operation is applied to check that the data is correct.

As noted above, an ECC algorithm may be used to correct data errors. The number of errors that can be corrected depends on the correction strength of the algorithm used. Simple Hamming codes provide the easiest hardware implementation, but can only correct single-bit errors. Reed-Solomon codes can provide a more robust error correction and are used on many of today's controllers. Also, "Bose, Ray-Chaudhuri, Hocquenghem" (BCH) codes are becoming popular due to their improved efficiency.

Returning to FIG. 7, recall that certain elements are affected less by coupling than others. As a rule, the last programmed row in a page will not be affected by adjacent cell coupling. Hence one can expect fewer errors on this row than on other rows. Also, rows having greater spacing are also more reliable.

Figure 10:
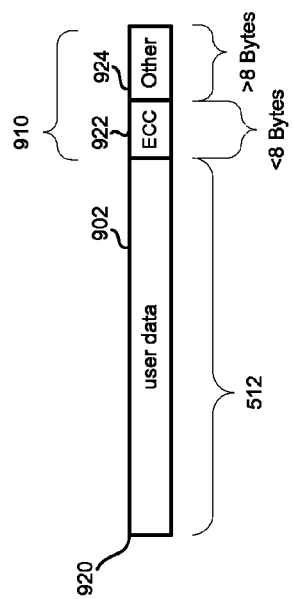
FIG. 10 illustrates an alternative page of information in accordance with the present technology.

In accordance with the technology, space occupied by the ECC in the user attribute section of a sector is instead used for other page level or block level information. This freed ECC space can be used to store block level information in one or more pages within the block for which the information is provided. As such, an exemplary data structure for a sector in a less-affected row is shown in FIG. 10. Sector 920 includes user data 902, which may comprise 512 bytes of user data, and a 16 byte spare data region 910. Spare data region 910 includes ECC data 922 and other data 924. The other data 924 now occupies some of the freed ECC data space. Other data may now include block level overhead information as well as user data overhead.

In a typical four-state multi-state memory device application, 6-8 bit of ECC correction is used per sector. ECC is applied to each 512 bytes of user data in each page. Using the example of the BCH ECC, for each bit of error detection and error correction, 26 check bits are required (1 symbol required for detection and one symbol required for correction, and 13 bits required per symbol). For each bit in error, detection and correction requires two bits, and detection of an error alone requires one bit. Hence, for 6 bits of correction per every 512 bytes, 6×26 bits or 156 check bits are required; 8 bit ECC per 512 Bytes requires 206 bits of extra ECC check bits per 512 Bytes information. Each user sector typically contains 512 user Bytes plus additional overhead information, part of this overhead information being the ECC check bits. In NAND architectures one page can consist of several sectors. For example, in some architecture, one page consists of 8 sectors. To implement 6 bit BCH ECC for this page the number of overhead check bits required would 8×6×26=1248 bits. On the other hand, to implement 7 bit BCH ECC for this page the number of overhead check bits required would 8×7× 26=1456 bits. And to implement 8 bit BCH ECC for this page, the number of overhead check bits required would 8×8× 26=1664 bits. Therefore, if most pages have 8 bit ECC per sector, but one page per block that may be inherently more reliable has 7 bits ECC per sector, then 208 bits (1664-1456=208) are freed up in that more reliable page. This large number of freed up bits can then be diverted for other uses such as storing block wide information. Typically the cells on a single word line (or row) comprise 4 pages.

The gain in reliability by going from no error correction capability to 1 bit error correction capability per sector is very significant. The incremental gain in reliability by going form 1 bit error correction capability per sector to 2 bit error correction capability per sector is less significant, and the trend of diminishing returns in terms of incremental reliability gain associated with the addition of 1 more bit of error correction capability continues as the number of bits of error correction capability is increased. Hence, reducing the ECC capability by one bit from 8 bits to 7 has far less impact on reliability as compared to reducing the ECC capability by one bit from 1 bit to 0.

In accordance with the technology, ECC detection may be reduced to as low as 1 bit per page, and correction to as low as 2 bits per page. It should be recognized that a reduction from 8 bit ECC to 7 bit ECC is much less drastic than a reduction from 2 bit to 1 bit ECC. Hence, ECC correction rates of 3-7 bits per reliable line may be used without substantially affecting the performance of the memory device. However in most cases, in order to free up a sufficient number of bits on some page, all that is required is to reduce the ECC capability by only a single bit of error correction capability in order to create a large number of freed up bits. As long as the standard number of error corrections capability is as large as 5, 6, 7, or 8 bits per sector, then the loss of reliability by reducing this large standard value by 1 is small and can easily be made up for choosing an inherently more reliable page on which to apply the lower ECC capability.

As noted above, one or more word-lines may be designed with increased spacing and/or line width relative to other word lines in order to take advantage of the techniques discussed herein. In one embodiment, where a number of pages are provided in each word line, the same word line in each block is utilized. This uneven spacing and/or line width already exists due to lithography limitations and can simply be taken advantage of to create freed up bits by lowering ECC capability when possible.

Optimally, the savings in space achieved by reducing the ECC resolution is used to store additional block level data in this row. Such data may include, for example, block hot count, compressed block hot count, a block rewrite flag, and logical to physical translation information. The block hot count reflects the number of times a particular page of data has been erased and re-written. The compressed hot count is a technique (reflected in U.S. Pat. No. 7,113,432, fully incorporated herein by reference) for recognizing the hot count in a more compact fashion. The block rewrite flag is information such as that reflected in U.S. patent application Ser. No. 11/425,790, filed Jun. 22, 2006, entitled "Method For Non-Real Time Reprogramming Of Non-Volatile Memory To Achieve Tighter Distribution Of Threshold Voltages", assigned to the assignee of the present application and fully incorporated herein by reference.

This provides a number of advantages. First, although techniques exist to store block level information in pages of other blocks or in other pages, such techniques require a two step write process. In contrast, using the present technology, the write process for the user data and the block level data may be performed sequentially. This greatly increases the efficiency of writing the information. In addition, read performance is improved since the block level data is associated with the block is included in the block read. This eliminates the need for partial programming of multiple pages for each write operation.

It should be recognized further that any row which is less subject to adjacent cell coupling may take advantage of the technology disclosed herein. For example, under a different programming scheme, any of the rows in a page may be programmed last, and such row may accommodate reducing the ECC information in such row. In addition, it is not uncommon to have dummy rows within an array which are not programmed. Any row adjacent to a dummy row can also be considered to have more robust data, and may allow for the ECC information space required by such row to be reduced. Other rows which may be used in accordance with the technology are rows which are physically designed to be isolated from adjacent rows. For example, any row whose spacing from an adjacent row is sufficient to substantially reduce cell to cell coupling may allow for the advantages of the present technology. In one example, one or more rows may be created with additional spacing and/or isolation structures from adjacent rows allowing use of the other information space for block level data.

Note that in the method of FIG. 8, when the read steps are performed, the ECC data for pages having a data structure of FIG. 10 will still be calculated, but the amount of errors tolerated step 810 will be less, since less ECC information is available for correction. However, less error should be found in this row since the effect of floating-gate to floating-gate coupling is negligible or eliminated.

The above examples are provided with respect to NAND type flash memory. However, the principles of the present invention have application to other types of flash memories and other types of non-volatile memories, including those currently existing and those contemplated to use new technology being developed.

In a further alternative, other information for other pages or other blocks may be stored in the freed ECC spacing within a page. Such techniques provide additional overhead spacing but do not provide the sequential read/write advantages or the minimal write disturb exposure of placing the block level overhead data for the block in a page which resides in the same block.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of storing information in data cells organized as a plurality of pages in a memory device, a subset of the plurality of pages comprising a block of data, comprising:
   storing user data in a page of said block, said page having a higher degree of data integrity than others of said plurality of pages;
   storing data attribute information including error correction code (ECC) in a portion of a data sector of the page; and
   storing block level data attributes in a second portion of the data sector, said second portion of the data sector being a location occupied by ECC information in said others of said pages.

2. The method of claim 1 wherein the step of storing block level data attributes includes storing logical block information.

3. The method of claim 1 wherein the step of storing block level data attributes includes storing one or more of a block hot count, compressed block hot count, a block rewrite flag, and logical to physical translation information.

4. The method of claim 1 wherein the step of storing attribute information includes storing information for less than 8 bits of ECC resolution.

5. The method of claim 1 wherein the step of storing block level data attributes includes storing logical block information in the last programmed row in a page.

6. The method of claim 1 wherein the step of storing block level data attributes includes storing logical block information in a row having a greater level of isolation from other rows in the page.

7. The method of claim 1 wherein the step of storing block level data attributes includes storing logical block information in at least one to seven bytes of information in the page.

8. A method of storing memory device data overhead information in data cells in a row of cells, the row being one of a plurality of rows comprising a unit of data, each of the plurality of rows including data and user attribute data, the user attribute data including ECC data, comprising:
   storing user data in a first portion of a data sector of a row having a greater data reliability than others of said rows; and
   storing said block level data attributes in a second portion of the data sector.

9. The method of claim 8 wherein the step of storing comprises storing said block level attributes in the second portion of the data sector wherein said second portion of the data sector in said others of said rows is occupied by error correction code (ECC) information.

10. The method of claim 8 wherein the step of storing data attributes includes storing logical block information.

11. The method of claim 8 wherein the step of storing data attributes includes storing one of a block hot count, compressed block hot count, a block rewrite flag, and logical to physical translation information.

12. The method of claim 8 wherein the step of storing data attributes includes storing logical block information in the last programmed row in a page.

13. The method of claim 8 wherein the step of storing block level data attributes includes storing logical block information in a row having a greater level of isolation from other rows in the page.

14. The method of claim 8 wherein the step of storing data attributes includes storing logical block information in at least one to seven bytes of information in the page.

15. The method of claim 8 wherein the step of storing user attribute data includes storing information for less than 8 bits of ECC information for the user data.

16. A method of operating a memory device, comprising:
reading user data from addressable pages and blocks in a data array, the user data having associated attribute data;
reading page attribute information including error correction code (ECC) information from a data sector of a first page, the page attribute information being stored adjacent to user data; and
reading block level data attributes from the data sector, the first page having a higher degree of data integrity than others of said pages.

17. The method of claim 16 wherein the step of reading data attributes includes reading logical block information.

18. The method of claim 16 wherein the step of reading data attributes includes reading one of a block hot count, compressed block hot count, a block rewrite flag, and logical to physical translation information.

19. The method of claim 16 wherein the step of reading data attributes includes reading logical block information from the last programmed row in a page.

20. The method of claim 16 further including the steps, prior to said steps of reading, of:
storing page attribute information including error correction code (ECC) in a portion of the data sector; and
storing block level data attributes for the user data of the data sector of said first page.

* * * * *